United States Patent
Wakiyama et al.

(10) Patent No.: US 9,953,848 B2
(45) Date of Patent: Apr. 24, 2018

(54) SUBSTRATE LIQUID PROCESSING APPARATUS

(71) Applicant: Tokyo Electron Limited, Tokyo (JP)

(72) Inventors: Terufumi Wakiyama, Kumamoto (JP); Norihiro Ito, Kumamoto (JP); Jiro Higashijima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 14/580,557

(22) Filed: Dec. 23, 2014

(65) Prior Publication Data

US 2015/0187613 A1 Jul. 2, 2015

(30) Foreign Application Priority Data

Dec. 27, 2013 (JP) .................................. 2013-272204
Oct. 16, 2014 (JP) .................................. 2014-211908

(51) Int. Cl.
*H01L 21/67* (2006.01)
*H01L 21/687* (2006.01)

(52) U.S. Cl.
CPC .... *H01L 21/67051* (2013.01); *H01L 21/6715* (2013.01); *H01L 21/68728* (2013.01)

(58) Field of Classification Search
CPC ........... H01L 21/67051; H01L 21/6715; H01L 21/68728
USPC ................................. 134/95.1, 902
See application file for complete search history.

(56) References Cited

U.S. PATENT DOCUMENTS

2007/0240638 A1* 10/2007 Akimoto ........... H01L 21/67051
118/52

FOREIGN PATENT DOCUMENTS

| JP | 04-144121 A | 5/1992 |
|---|---|---|
| JP | 10-098020 A | 4/1998 |
| JP | 2004-265912 A | 9/2004 |
| JP | 2005-019675 A | 1/2005 |
| JP | 2011-238967 A | 11/2011 |
| JP | 2012-099582 A | 5/2012 |
| JP | 2013-033922 A | 2/2013 |

OTHER PUBLICATIONS

Riichiro, Harano, "JP2004265912A English Machine Translation.pdf", Sep. 24, 2004—Machine translation from Espacenet.com.*

* cited by examiner

*Primary Examiner* — Levon J Shahinian
(74) *Attorney, Agent, or Firm* — Abelman, Frayne & Schwab

(57) ABSTRACT

A substrate liquid processing apparatus of the present disclosure supplies a plurality of processing liquids from a processing liquid supplying unit in a switching manner to a substrate held on a substrate holding unit. An elevatable inner cup surrounds the substrate holding unit laterally and forms a first drain path that drains the first processing liquid. An outer cup surrounds the inner cup and forms a second drain path that drains the second processing liquid. A cover covers the outside of the outer cup, includes an eaves portion that extends inwardly from an upper side, and forms an exhaust path between the cover and the outer cup. The exhaust path is connected to the first drain path and the second drain path above inlets of the first drain path and the second drain path.

15 Claims, 13 Drawing Sheets

SUBSTRATE LIQUID PROCESSING APPARATUS

CROSS-REFERENCE TO RELATED APPLICATIONS

This application is based on and claims priority from Japanese Patent Application Nos. 2013-272204 and 2014-211908, filed on Dec. 27, 2013 and Oct. 16, 2014, respectively, with the Japan Patent Office, the disclosures of which are incorporated herein in their entireties by reference.

TECHNICAL FIELD

The present disclosure relates to a substrate liquid processing apparatus in which a substrate is processed by supplying a processing liquid thereto.

BACKGROUND

In a single wafer liquid processing unit (a substrate liquid processing apparatus) in which a liquid processing is performed on a semiconductor wafer (hereinafter, referred to as a "wafer") serving as a substrate by supplying various processing liquids, an alkaline or acidic chemical liquid is supplied to a wafer surface that is rotating to remove dusts or natural oxides from the wafer surface. The chemical liquid remaining on the wafer surface is removed by a rinse liquid. When the supply of the rinse liquid is stopped while rotating the wafer, the remaining rinse liquid is scattered so that the wafer is dried.

In the liquid processing unit, a recovery cup is provided around the rotating wafer to receive the processing liquid scattered from the wafer by an action of a centrifugal force and guide the processing liquid to a drain port.

For example, Japanese Patent Laid-Open Publication No. 2004-265912 discloses a processing unit in which a pot is provided to surround a substrate held in a spin chuck, a plurality of annular partitions is arranged in a nest form inside the pot, and a plurality of annular flow paths for recovering a processing liquid is configured to be switchable in the pot or between the annular partitions by moving the annular partitions vertically (see, e.g., paragraphs 0026, 0060 to 0061, 0067, 0088 to 0096, and FIGS. 1 and 14 to 16). The pot or the annular partitions as described in Japanese Patent Laid-Open Publication No. 2004-265912 correspond to the above-mentioned recovery cup.

In the processing unit described in Japanese Patent Laid-Open Publication No. 2004-265912, the processing liquid scattered from the substrate is received in the pot or the annular partitions each constituting an annular flow path, and the processing liquid is sorted and discharged towards a specific annular flow path such that the processing liquid is recovered through the annular flow path. Further, annular flow paths, which are not involved in the recovery of the processing liquid, are configured such that their openings are closed by disposing the pot and the annular partitions to be overlapped at a position close to each other. Therefore, the processing liquid is not allowed to flow therein.

SUMMARY

A substrate liquid processing apparatus of the present disclosure includes: a substrate holding unit configured to hold a substrate; processing liquid supplying unit configured to supply a plurality of processing liquids in a switching manner to the substrate held on the substrate holding unit; an inner cup provided to surround the substrate holding unit laterally and to form a first drain path that guides a first processing liquid supplied to the substrate downwardly of the substrate holding unit and drains the first processing liquid; an outer cup provided to surround the inner cup and to form a second drain path that guides a second processing liquid supplied to the substrate downwardly of the substrate holding unit and drains the second processing liquid; an elevating mechanism configured to move up and down the inner cup between a processing position where the inner cup receives the first processing liquid and a retreat position where the inner cup retreats downwardly from the processing position; and a cover disposed to cover the outside of the outer cup. The cover includes a cylindrical portion formed in a cylindrical shape and an eaves portion provided in an upper portion of the cylindrical portion and extends inwardly, and forms an exhaust path between the cover and the outer cup. The exhaust path is connected to the first drain path and the second drain path at an upper side of inlets of the first drain path and the second drain path.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
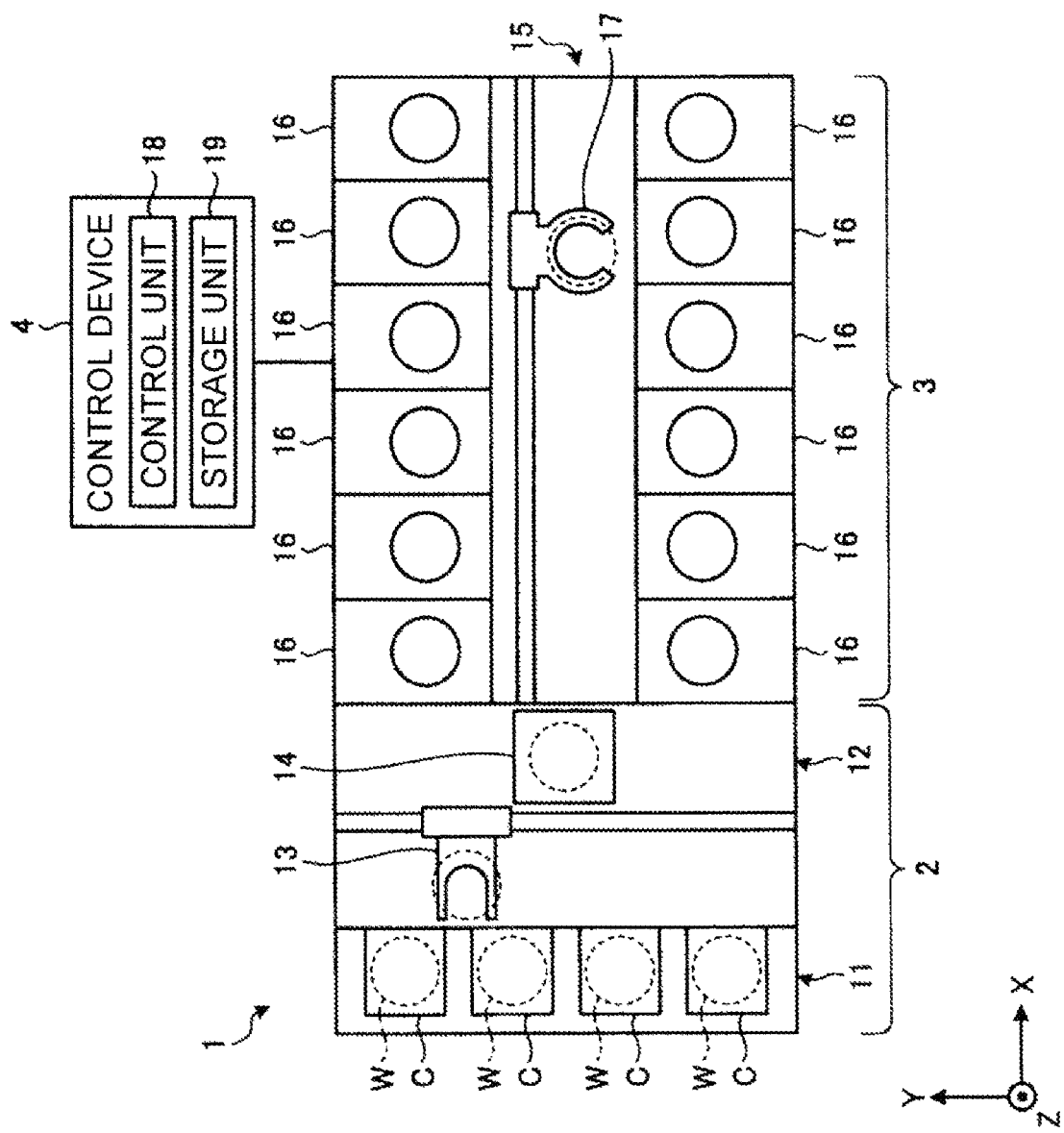
FIG. 1 is a plan view illustrating an outline of a substrate processing system provided with a processing unit according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the processing unit described in Japanese Patent Laid-Open Publication No. 2004-265912, all the annular flow paths are connected to an exhaust device such that the inside of the annular flow paths is evacuated. Thus, even though the openings of the annular flow paths, which are not involved in the recovery of the processing liquid, are closed, the inside of the annular flow paths is decompressed by the exhaust, so that the processing liquid enters into gaps between the port and the annular partitions, which are disposed to be overlapped with each other. Therefore, the processing liquid may not be recovered to a predetermined recovery site, or some processing liquid may enter other recovery sites, thereby contaminating the processing liquid in the recovery sites.

The present disclosure has been made in consideration of such problems and an object of the present disclosure is to provide a substrate liquid processing apparatus capable of discharging a plurality of processing liquids to predetermined drain paths.

In an exemplary embodiment, the present disclosure provides a substrate liquid processing apparatus of the present disclosure including: a substrate holding unit configured to hold a substrate; processing liquid supplying unit configured to supply a plurality of processing liquids in a switching manner to the substrate held on the substrate holding unit; an inner cup provided to surround the substrate holding unit laterally and to form a first drain path that guides a first processing liquid supplied to the substrate downwardly of the substrate holding unit and drains the first processing liquid; an outer cup provided to surround the inner cup and to form a second drain path that guides a second processing liquid supplied to the substrate downwardly of the substrate holding unit and drains the second processing liquid; an elevating mechanism configured to move up and down the inner cup between a processing position where the inner cup receives the first processing liquid and a retreat position where the inner cup retreats downwardly from the processing position; and a cover disposed to cover the outside of the outer cup. The cover includes a cylindrical portion formed in a cylindrical shape and an eaves portion provided in an upper portion of the cylindrical portion and extends inwardly, and forms an exhaust path between the cover and the outer cup. The exhaust path is connected to the first drain path and the second drain path at an upper side of inlets of the first drain path and the second drain path.

The substrate liquid processing apparatus may have the following configurations.

(a) Besides the exhaust path, only drain pipes, each of which discharges a processing liquid, is connected to the first drain path and the second drain path.

(b) The substrate liquid processing apparatus further includes a rotary cup configured to rotate integrally with the substrate holding unit to guide the processing liquids towards a disposition direction of the inner cup or the outer cup that receives the processing liquids. A part of the exhaust path is formed between the cover and the rotary cup.

(c) In (b), a top surface portion is formed in an upper portion of the outer cup. The top surface portion includes a tip end portion that extends inwardly towards an outer peripheral surface of the rotary cup and faces the outer peripheral surface of the rotary cup to form a part of the exhaust path. A plurality of protrusions is formed in a region of the tip end portion that faces the rotary cup. The plurality of protrusion being arranged along a circumferential direction of the rotary cup to be spaced apart from each other and extending vertically. Further, each of the protrusions is formed obliquely such that its upper end portion is positioned closer to an upstream side in a rotational direction of the rotary cup than its lower end portion.

(d) In (b), a top surface portion is formed in an upper portion of the outer cup. The top surface portion including a tip end portion that extends inwardly towards an outer peripheral surface of the rotary cup. A tip end of the eaves portion constituting the cover faces the outer peripheral surface of the rotary cup. A distance between the eaves portion and the rotary cup is narrower than a distance between the rotary cup and the tip end portion.

(e) The exhaust path includes a collecting exhaust unit formed therein and configured to cause a gas exhausted along the circumferential direction of the outer cup to interflow and then discharge the gas to the outside. The substrate liquid processing apparatus further includes an inlet configured to allow the gas to flow into the collecting exhaust unit, and the inlet is a slit. An opening area of the inlet configured to allow the gas to flow into the collecting exhaust unit is smaller than an opening area of an exhaust port for discharging the gas from the collecting exhaust unit to the outside. The collecting exhaust unit is formed at a lower side of the inner cup and the outer cup. The inner cup and the outer cup are provided with drain pipes each communicating with a drain port configured to drain the first processing liquid or the second processing liquid, and the drain pipes penetrates through the collecting exhaust unit. The elevating mechanism moves up and down the inner cup through a support member configured to support the inner cup, the elevating mechanism is disposed bellow the collecting exhaust unit, and the support member penetrates through the collecting exhaust unit. The substrate liquid processing apparatus further includes a cleaning mechanism configured to clean the inside of the collecting exhaust unit.

(f) The substrate liquid processing apparatus further includes a cleaning mechanism configured to clean the inside of the exhaust path.

In the present disclosure, an exhaust path is formed to perform exhaust of gas, independently from the inner cup and the outer cup, which form a plurality of drain paths to receive processing liquids scattered from a substrate that is rotating, and discharge the processing liquids to a drain port. Therefore, a plurality of processing liquids may be sorted and discharged.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a conveyance section 12. In the carrier placing section 11, a plurality of carriers C is placed to accommodate a plurality of substrates (semiconductor wafers in the present exemplary embodiment) (hereinafter, referred to as "wafers W") horizontally.

The conveyance section 12 is provided adjacent to the carrier placing section 11, and provided with a substrate conveyance device 13 and a delivery unit 14. The substrate conveyance device 13 is provided with a wafer holding mechanism configured to hold the wafer W. Further, the substrate conveyance device 13 is movable horizontally and vertically and pivotable around a vertical axis, and conveys the wafers W between the carriers C and the delivery unit 14 by using the wafer holding mechanism.

The processing station 3 is provided adjacent to the conveyance section 12. The processing station 3 is provided with a conveyance section 15 and a plurality of processing units 16. The plurality of processing units 16 is arranged at both sides of the conveyance section 15.

The conveyance section 15 is provided with a substrate conveyance device 17 therein. The substrate conveyance device 17 is provided with a wafer holding mechanism configured to hold the wafer W. Further, the substrate conveyance device 17 is movable horizontally and vertically and pivotable around a vertical axis. The substrate conveyance device 17 conveys the wafers W between the delivery unit 14 and the processing units 16 by using the wafer holding mechanism.

The processing units 16 perform a predetermined substrate processing on the wafers W conveyed by the substrate conveyance device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate conveyance device 13 of the carry-in/out station 2 first takes out a wafer W from a carrier C placed in the carrier placing section 11, and then places the taken wafer W on the conveyance unit 14. The wafer W placed on the conveyance unit 14 is taken out from the conveyance unit 14 by the substrate conveyance device 17 of the processing station 3 and carried into a processing unit 16.

The wafer W carried into the processing unit 16 is processed by the processing unit 16, and then, carried out from the processing unit 16 and placed on the delivery unit 14 by the substrate conveyance device 17. After the processing of placing the wafer W on the delivery unit 14, the wafer W returns to the carrier C of the carrier placing section 11 by the substrate conveyance device 13.

Figure 2:
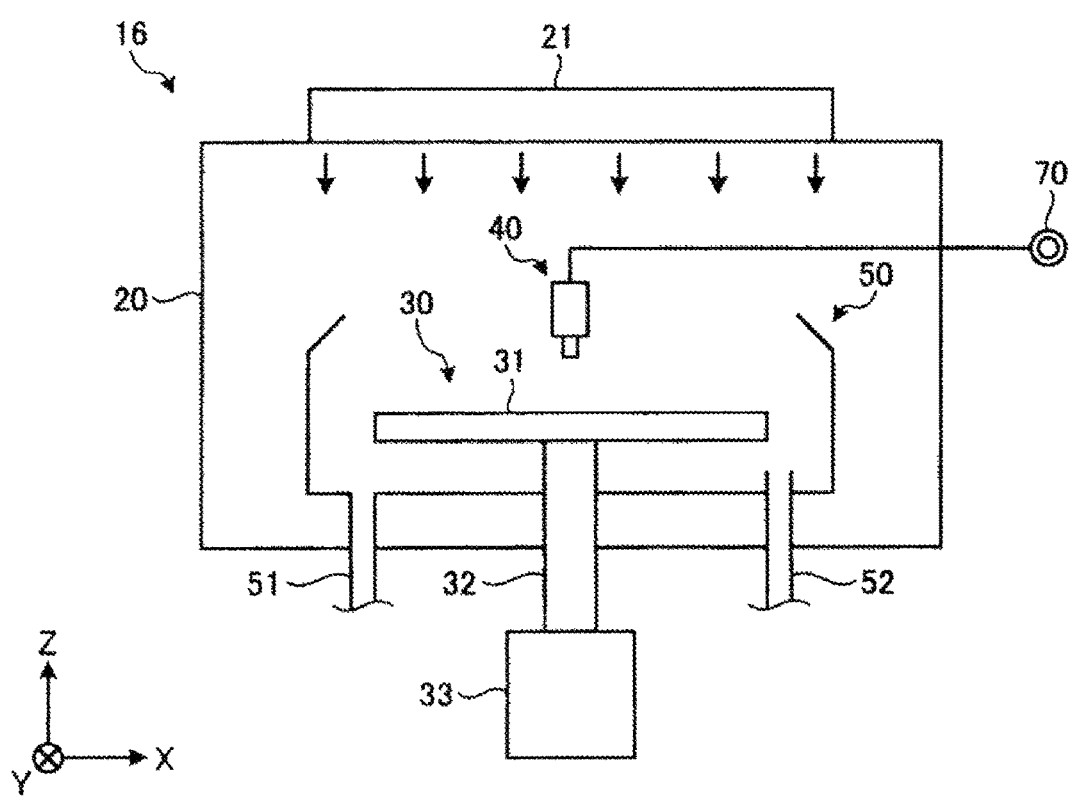
FIG. 2 is a vertical cross-sectional view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 as outlined above corresponds to the liquid processing apparatus of the present exemplary embodiment. The processing unit 16 may discharge a plurality of processing liquids scattered from the rotating wafer W and a gas (e.g., clean air) supplied from the FFU 21 and flowing around the wafer W through the drain port 51 (including a first drain pipe 512a, a second drain pipe 512b, and a third drain pipe 512c), and the exhaust port 52, respectively. Hereinafter, a configuration related to the above-described functions will be described with reference to FIGS. 3 and 4.

Figure 3:
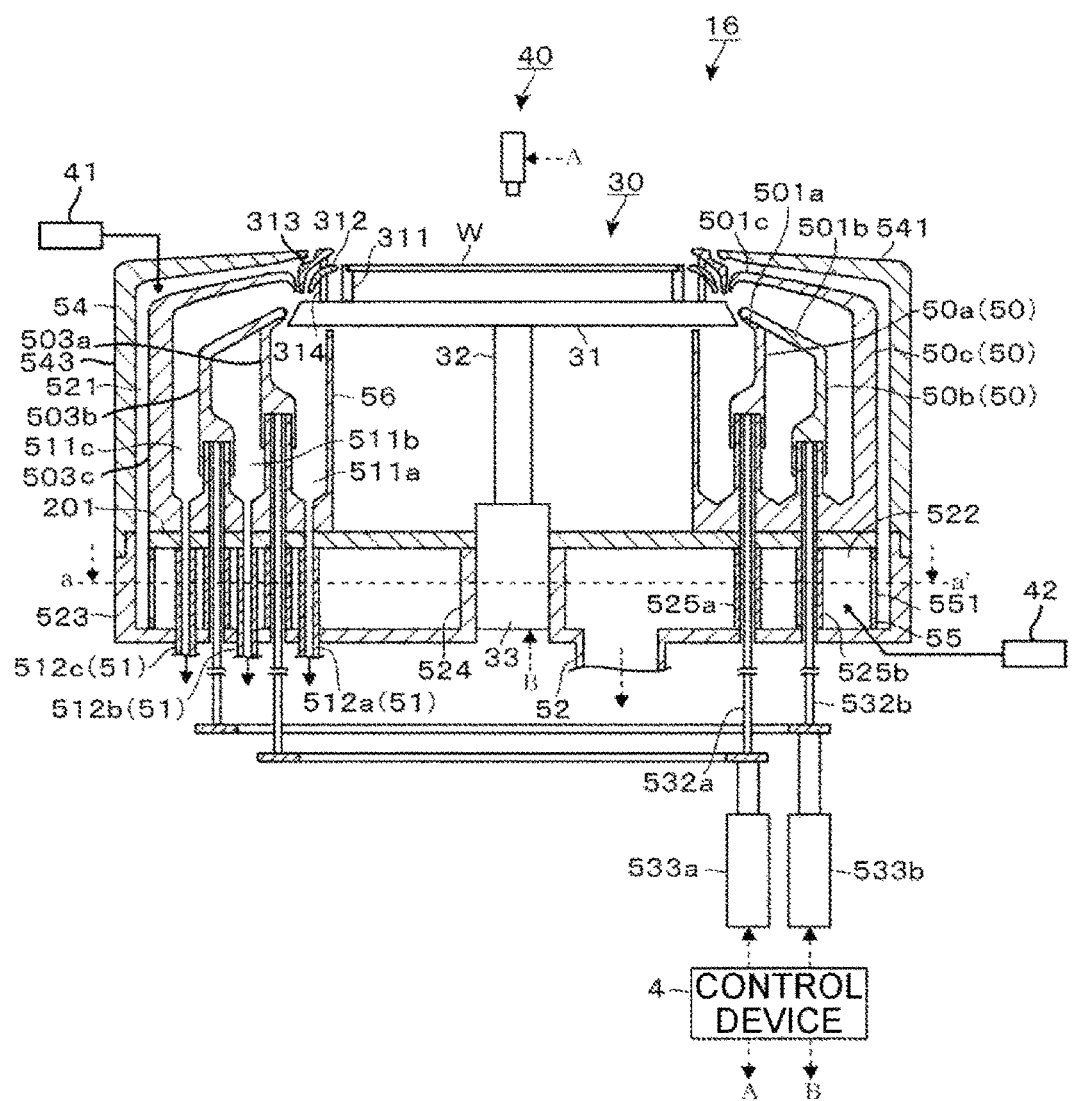
FIG. 3 is a vertical cross-sectional view illustrating details of a substrate holding mechanism and a recovery cup of the processing unit.

FIG. 3 is a vertical cross-sectional view illustrating details of the substrate holding mechanism 30 and the recovery cup 50 provided in the processing unit 16. The above-mentioned processing fluid supply unit 40 configures a processing supply unit that takes different kinds of processing liquids from a processing fluid supply source 70, and supplies the different kinds of processing liquids in a switching manner to the wafer W.

Further, as illustrated in FIG. 3, a plurality of support pins 311 is provided in the peripheral edge of the top surface of the holding unit 31 to support the wafer W, and a processing is performed in a state where the wafer W is supported by the support pins 311. The holding unit 31 and the support pins 311 correspond to the substrate holding unit in the present exemplary embodiment.

A guide 312 is provided at the lateral side of the wafer W supported by the support pins 311 to guide the processing liquid scattered from the wafer W. The guide 312 is provided with an inclined surface in which the height positions of its upper surface and lower surface are lowered gradually from an inner position where the wafer W is disposed towards an outer position where the recovery cup 50 is disposed.

A rotary cup 313 is provided above the guide 312 is to guide the processing liquid scattered from the wafer W or the gas supplied from the FFU 21 along with the guide 312. The rotary cup 313 is disposed at a position forming a gap between the rotary cup 313 and the top surface of the guide 312 to cover the upper portion of the guide 312. Like the guide 312, an inclined surface is formed on the bottom side of the rotary cup 313 such that the height position is lowered gradually from the inner side to the outer side. The processing liquid scattered from the wafer W or an air flow flowing on the surface of the wafer W is guided towards the recovery cup 50 through the gap between the guide 312 and the rotary cup 313. The guide 312 and the rotary cup 313 extend upwardly from the top surface of the holding unit 31 and are supported by a plurality of support members 314 which is arranged along the circumferential direction of the holding unit 31 to be spaced apart from each other.

In the processing unit 16 of the present exemplary embodiment, the above-mentioned rotary cup 50 configured to collect the processing liquid scattered from the wafer W is formed to surround the holding unit 31. The processing unit 16 of the present exemplary embodiment is provided with three rotary cups 50. Hereinafter, these rotary cups 50 are referred to as a first cup 50a, a second cup 50b, and a third cup 50c sequentially from the inside close to the holding unit 31.

The third cup 50c at the outermost position is disposed to be fixed on a bottom plate 201 which constitutes a part of the third cup 50c. In the processing unit 16 of the present exemplary embodiment, the first cup 50a and the second cup 50b correspond to the inner cups, and the third cup 50c corresponds to the outer cup.

The first cup 50a is disposed at the closest position to the holding unit 31 such that its inner wall surface faces towards a position where the processing liquid guided by the guide 312 and the rotary cup 313 flows out. The first cup 50a is provided with a cylindrical portion 503a that is formed in a cylindrical shape, and an inclined portion 501a that is formed along the circumferential direction of the upper portion of the cylindrical portion 503a and inclined inwardly. The inclined portion 501a performs a role to suppress the processing liquid from flowing out upwardly of the first cup 50a and block openings of the recovery cups 50 (the second cup 50b and the third cup 50c) which do not recover the processing liquid. Further, the inner periphery of the inclined portion 501a surrounds the periphery of the holding unit 31 when the first cup 50a is moved down.

The bottom surface of the first cup 50a is supported by a plurality of support members 532a which are arranged in the circumferential direction to be spaced apart from each other. The support members 532a are connected to a common actuator 533a including, for example, an air cylinder. When the actuator 533a is driven to move up and down the support members 532a, the first cup 50a may move between the processing position where the processing liquid scattered from the rotating wafer W and a retreat position retreated downwardly from the processing position. The support member 532a and the actuator 533a correspond to the elevating mechanism of the first cup 50a.

Figure 7:
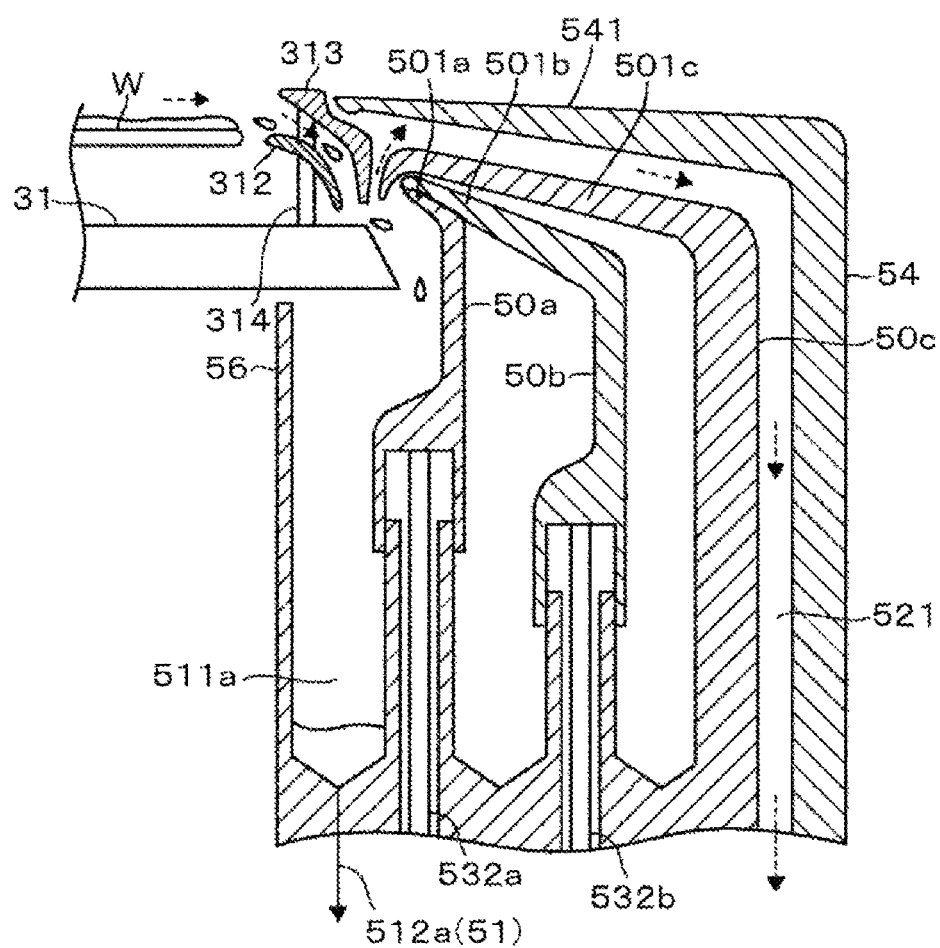
FIG. 7 is a third explanatory view illustrating an action of the processing unit.

As illustrated in FIG. 7, when the first cup 50a is moved up to the processing position, the inner space of the first cup 50a may be configured as a path in which the processing liquid flows. The processing liquid scattered from the rotating wafer W is received to the inner wall surface of the first cup 50a, and guided downwardly of the holding unit 31 while flowing down in the path, to be drained.

Meanwhile, the cylindrical member provided between the first cup 50a and the support unit 32 is a surrounding member 56 to suppress the processing liquid or mists from entering into the holding unit 31.

The second cup 50b is disposed at a position outside the first cup 50a, and is similar to the above-mentioned first cup 50a in that an annular inner wall surface is disposed to face towards a position where the processing liquid guided by the guide 312 and the rotary cup 313 flows out and in that an inclined portion 501b is formed in an upper portion of a cylindrical portion 503b to be inclined inwardly.

Here, the inclined portion 501b of the second cup 50b is formed to extend to an upward side of the inclined portion 501a of the first cup 50a. The bottom surface of the inclined portion 501b of the second cup 50b is brought into contact with the top surface of the inclined portion 501a of the first cup 50a such that the inclined portions 501a, 501b are overlapped with each other. When the inclined portions 501a, 501b are overlapped, the opening through which the processing liquid flows into the second cup 50b is blocked. Further, when the second cup 50b is moved down, the inner periphery of the inclined portion 501b surrounds the periphery of the holding unit 31 along with the inclined portion 501a of the first cup 50a.

Further, like the first cup 50a, the second cup 50b is supported by a plurality of support members 532b which are arranged in the circumferential direction to be spaced apart from each other. The support members 532a are connected to a common actuator 533b. As a result, the second cup 50b may also move between the processing position in the upward side and a retreat position retreated downwardly from the processing position. The support member 532b and the actuator 533b correspond to the elevating mechanism of the second cup 50b.

Figure 6:
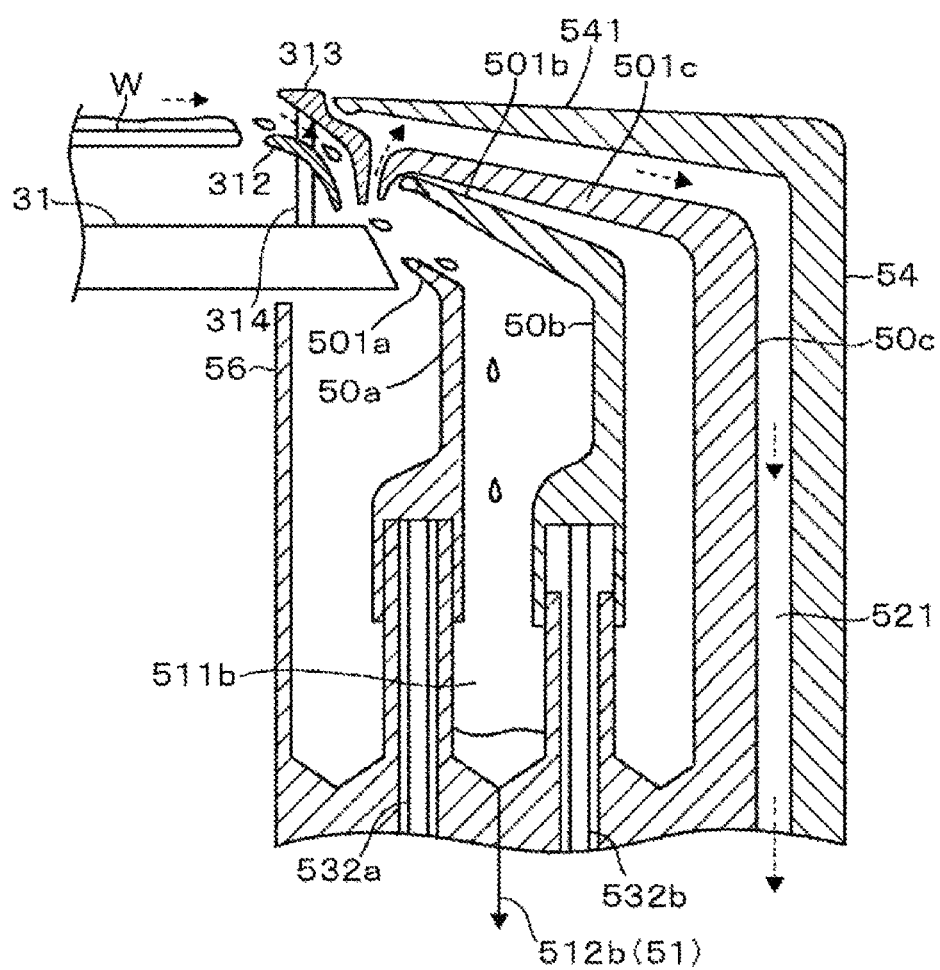
FIG. 6 is a second explanatory view illustrating an action of the processing unit.

As illustrated in FIG. 6, a flow path is formed between the outer wall surface of the first cup 50a and the inner wall surface of the second cup 50b when the first cup 50a is moved down to the retreat position while the second cup 50b is moved up to the processing position. The processing liquid scattered from the rotating wafer W is received to the inner wall surface of the second cup 50b, and guided downwardly of the holding unit 31 while flowing down in the path, to be discharged.

Subsequently, as illustrated in FIG. 3, the third cup 50c is disposed at a position outside the first cup 50a and the second cup 50b. When the first cup 50a and the second cup 50b are moved to the retreat position, its inner wall surface faces towards a position where the processing liquid guided by the guide 312 and the rotary cup 313 flows out. The third cup 50c is provided with a cylindrical portion 503c and an inclined portion 501c that is formed in the upper portion of the cylindrical portion 503c and inclined inwardly. The inclined portion 501c extends to the upper side of the first cup 50a or the second cup 50b. Further, the inner periphery of the inclined portion 501c surrounds the periphery of the rotary cup 313.

Further, the tip end portion of the inclined portion 501c of the third cup 50c is bent downwardly. As illustrated in the enlarged vertical cross-sectional view of FIG. 5, the bent portion is disposed to be spaced apart from the above-mentioned rotary cup 313 with a gap therebetween. The gap between the bent portion and the rotary cup 313 forms a flow path to guide the gas flowing out from the holding unit 31 upwardly.

As illustrated in FIG. 3, three drain grooves (a first drain groove 511a, a second groove 511b, and a third groove 511c) for discharging the processing liquid are formed at a position below the first cup 50a and the second cup 50b to be partitioned from each other along the circumferential direction of the cups 50a, 50b. The drain grooves 511a to 511c are connected to drain pipes 512a to 512c, respectively.

For example, the processing liquid received in the first cup 50a flows down to the drain groove 511a to be discharged from the drain port 51 at the end of the first drain pipe 512a to the outside through the first drain groove 511a and the first drain pipe 512a.

The space surrounded by the first cup 50a and the surrounding member 56, or the first drain groove 511a, which is in communication with the drain port 51, corresponds to the first drain path which guides the processing liquid received in the first cup 50a (the first processing liquid) downwardly of the holding unit 31 and drains the processing liquid.

Further, the processing liquid received in the second cup 50b flows down to the second drain groove 511b through a flow path between the first cup 50a and the second cup 50b to be discharged from the drain port 51 at the end of the first drain pipe 512b to the outside through the second drain groove 511b and the second drain pipe 512b.

The flow path between the first cup 50a and the second cup 50b, or the second drain groove 511b, which is in communication with the drain port 51, also corresponds to the first drain path which guides the processing liquid received in the second cup 50b (the first processing liquid) downwardly of the holding unit 31 and drains the processing liquid.

Further, the processing liquid received in the third cup 50c flows into the third drain groove 511c through a flow path between the second cup 50b and the third cup 50c to be discharged from the drain port 51 at the end of the first drain pipe 512c to the outside through the third drain groove 511c and the third drain pipe 512c.

The flow path between the second cup 50b and the third cup 50c, or the third drain groove 511c, which is in communication with the drain port 51, corresponds to the second drain path which guides the processing liquid received in the third cup 50c (the second processing liquid) downwardly of the holding unit 31 and drains the processing liquid.

In the processing unit 16 according to the present exemplary embodiment, an exhaust path (including a cylindrical flow path 521 and a collecting exhaust unit 522) is formed to exhaust the gas, which flows out from the holding unit 31, towards the exhaust port 52, independently from the drain paths of the processing liquids in respective recovery cups (the first cup 50a to the third cup 50c).

For the cylindrical flow path 521 constituting a part of the exhaust path, the processing unit 16 is provided with a cover 54 including an annular side wall disposed to cover the outside of the third cup 50c. A gap is formed between the inner wall surface of the cover 54 and the outer wall surface of the third cup 50c, and the gap is configured as the cylindrical flow path 521 in which a gas flow.

The cover 54 is also formed with an inclined portion 541, which is an eaves portion, at an upper portion of the cylindrical portion 543. The inclined 541 is disposed above the inclined portion 501c to be spaced apart from the top surface of the inclined portion 501c of the third cup 50c with a gap therebetween. Further, a tip end of the inclined portion 541 of the cover 54 extends to an upward side of a flow path of the gas, which is formed between the downward bent portion of the inclined portion 501c of the third drain pipe 512c and the rotary cup 313.

Accordingly, the gas flows into the cylindrical flow path 521 from the gap between the tip end of the inclined portion 541 of the cover 54 and the tip end of the inclined portion 501c of the third cup 50c, and the cylindrical flow path 521 is opened along a mouth of the third cup 50c. Therefore, a region surrounded by the first cup 50a, the second cup 50b and the third cup 50c is not in communication with the exhaust port 52 which is positioned below the cylindrical flow path 521.

Further, the processing unit 16 is provided with a cleaning mechanism 41 to clean the inner peripheral surface of the cover 54 or the outer peripheral surface of the third cup 50c, both of which constitute the cylindrical flow path 521. For example, the cleaning mechanism 41 may supply a cleaning liquid such as deionized water (DIW) from the upper portion of the cylindrical flow path 521 along the circumferential direction of the cylindrical flow path 521. Even though a gas including alkaline or acidic mists flows in the common cylindrical flow path 521 and produces reaction products which are then attached to the wall of the cylindrical flow path 521, the attached products may be washed out by providing the cleaning mechanism 41. The cleaning liquid after washing is discharged from a drain port (not illustrated) formed in the lower portion of the cylindrical flow path 521 or the collecting exhaust unit 522 to be described later.

Further, a tray 523 is provided below the above-mentioned bottom plate 201 (below the first cup 50a, the second cup 50b, and the third cup 50c). A side wall formed on the peripheral edge of the tray 523 is connected to the side wall of the cover 54, and the gas flowing from the cylindrical flow path 521 flows into a space surrounded by the bottom plate 201 and the tray 523. The above-mentioned exhaust port 52, which is connected to, for example, an external vacuum pump (suction mechanism), is formed on the bottom surface of the tray 523, and the gas is discharged from the exhaust port 52 to the outside. The space surrounded by the bottom plate 201 and the tray 203 constitutes the collecting exhaust unit 522 that causes a gas dispersing and flowing in the cylindrical flow path 521 to interflow, and then, discharges the gas to the outside.

Figure 5:
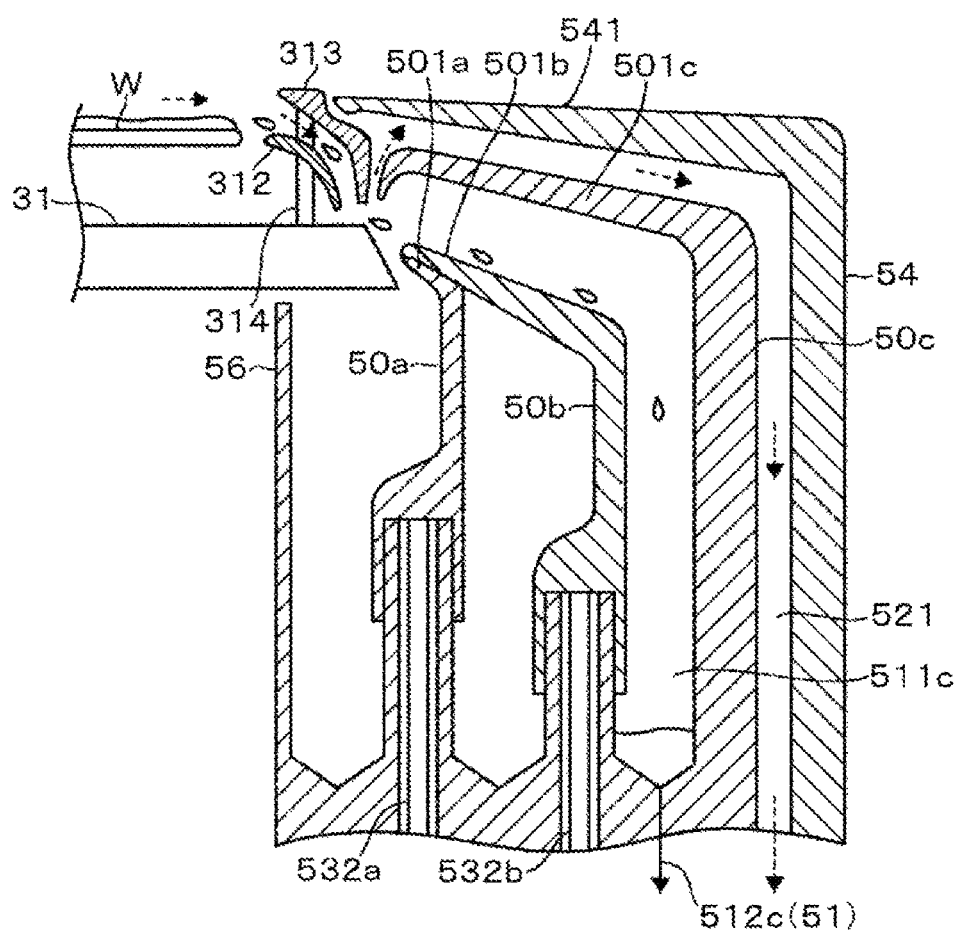
FIG. 5 is a first explanatory view illustrating an action of the processing unit.

To summarize the above descriptions, as illustrated in FIG. 5, a gas flow path is formed in the cylindrical flow path 521 formed between the inner peripheral surface of the cover 54 and the outer peripheral surface of the third cup 50c, and the space between the cover 54 and the rotary cup 313. The space between the cover 54 and the third cup 50c, the space between the cover 54 and the rotary cup 313, and the collecting exhaust unit 522 communicate with the exhaust port 52, thereby constituting the gas exhaust path.

Here, the exhaust path formed between the cover 54 and the third cup 50c is connected to the first drain path above the inlet of the space between the first cup 50a and the surrounding member 56, which constitute the first drain path, or the space between the first cup 50a and the second cup 50b (FIGS. 7 and 6). Further, the exhaust path is connected to the second drain path above the inlet of the space between the second cup 50b and the third cup 50c, which constitute the second drain path (FIG. 5).

Further, besides the above-mentioned exhaust path, only drain pipes (the first drain pipe 512a, the second drain pipe 512b, and the third drain pipe 512c), each of which discharges a processing liquid (the first processing liquid or the second processing liquid), the third cup 50c or the third drain groove 511c), is connected to the first drain path (the space surrounded by first cup 50a and the surrounding member 56 or the first drain groove 511a, and the flow path between the first cup 50a and the second cup 50b, or the second drain groove 511b) or the second drain flow path (the flow path between the second cup 50b.

Figure 4:
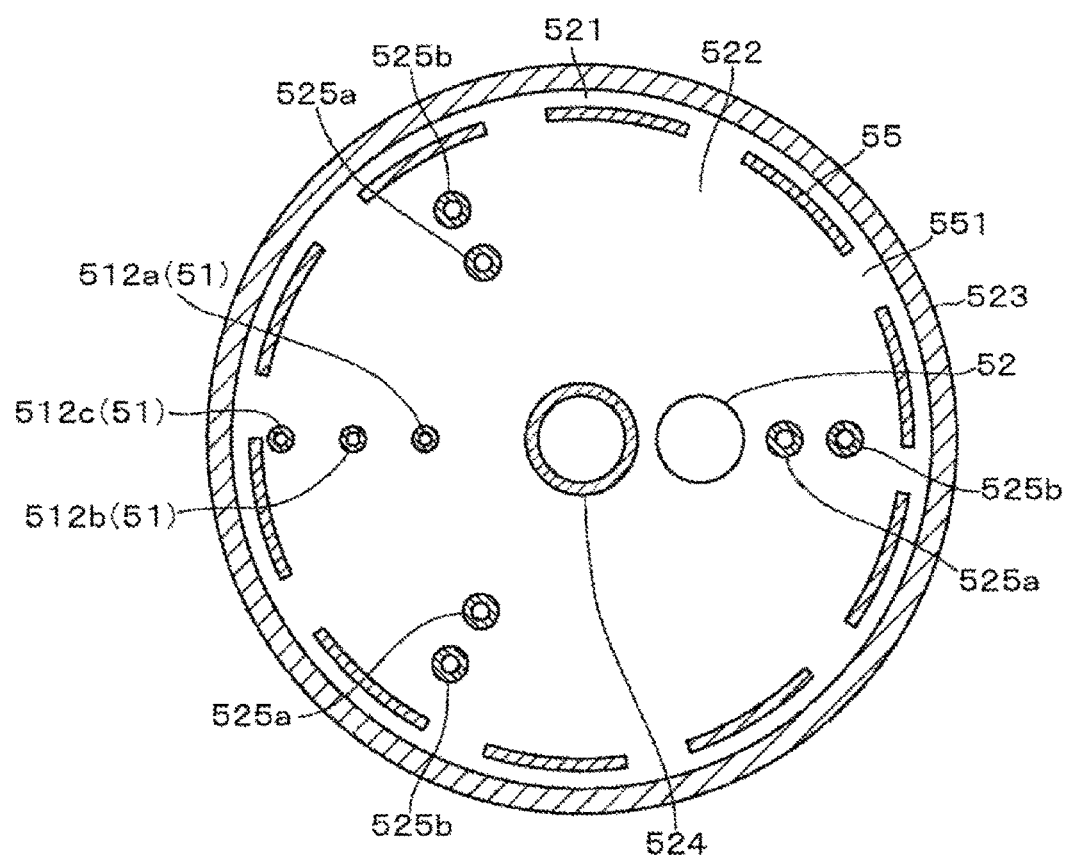
FIG. 4 is a horizontal cross-sectional view illustrating a collecting exhaust unit formed in the processing unit.

FIG. 4 is a horizontal cross-sectional view when the tray 523 is viewed in the direction indicated by arrows at a position a-a' of FIG. 3. As illustrated in FIGS. 3 and 4, a baffle ring 55 is provided at an outer peripheral position where the gas flowing in the cylindrical flow path 521 flows into the collecting exhaust unit 522 to surround the collecting exhaust unit 522 formed between the above-mentioned bottom plate 201 and the bottom surface of the tray 523.

In the baffle ring 55, for example, a plurality of vertically elongated slits 551 is disposed at substantially equal intervals. The slits 551 are configured such that the resistance is adjusted to be substantially uniform when the gas passes therethrough, and hence, the gas disperses and flows uniformly in the cylindrical flow path 521.

Further, the sum of the opening areas of the plurality of slits 551 serving as an inlet of the gas into the collecting exhaust unit 522 is set to be smaller than the opening area of the exhaust port 52 formed on the bottom surface of the tray 523. Therefore, a pressure loss when the gas flows inwardly of the baffle ring 55 from the slits 551 becomes larger than a pressure loss when the gas in the collecting exhaust unit 522 is discharged from the exhaust port 52. As a result, the gas flows inwardly of the baffle ring 55, thereby suppressing generation of a drift in which the gas is biased to a part of the slits 551.

Further, as illustrated in FIGS. 3 and 4, each of the drain pipes 512a to 512c penetrates through the collecting exhaust unit 522 vertically. Further, the collecting exhaust unit 522 is provided with sleeves 525a, 525b through which support members 532a, 532b penetrate and a cylindrical portion 524 that surrounds the driving unit 33.

As illustrated in FIG. 3, the processing unit 16 is provided with a cleaning mechanism 42 that cleans the inside of the collecting exhaust unit 522. For example, the cleaning mechanism 42 is provided with a two-fluid nozzle that ejects a mixed fluid of a cleaning liquid (e.g., DIW) and a carrier gas (e.g., clean air). Like the cleaning mechanism 41 of the cylindrical flow path 521, reaction products formed when a gas including alkaline or acidic mists flows may also be washed out from the inner wall surface of the collecting exhaust unit 522 in the cleaning mechanism 42. The cleaning liquid after washing is discharged from a drain port (not illustrated) formed on the bottom surface of the collecting exhaust unit 522.

In the processing unit as described above in detail, the operations of the supply of the processing liquids from the processing fluid supply unit 40, the switching of the kinds of the processing liquids, the rotation of the wafer W by the driving unit 33, and the moving-up and down of the first cup 50a and the second cup 50b are controlled by the above-mentioned control device 4.

Hereinafter, actions of the processing unit 16 of the present exemplary embodiment will be described. A wafer W conveyed to each processing unit 16 by the substrate conveyance device 17 is carried into the chamber 20 through the carry-in/out port (not illustrated). The substrate conveyance device 17 delivers a processing target wafer W onto the support pins 311 of the holding unit 31, and then, retreated from the inside of the chamber 20.

At this time, for example, as illustrated in FIG. 5, the first cup 50a and the second cup 50b are moved to the retreat position, so that a flow path is formed between the second cup 50b and the third cup 50c to allow a processing liquid to flow down. Then, the rotation of the wafer W is started, and a first processing liquid (e.g., an alkaline chemical liquid) is supplied from the processing fluid supply unit 40 to the wafer W, thereby starting the liquid processing.

As the processing liquid supplied onto the surface of the rotating wafer W is spread, the liquid processing is performed on the surface, and the processing liquid finally reaches the peripheral edge of the wafer W. The processing liquid which has reached the peripheral edge of the wafer W flows through a gap between the guide 312 and the rotary cup 313. Then, the processing liquid is scattered towards the third cup 50c. The scattered processing liquid is received onto the inner wall surface of the third cup 50c, and drops into the third drain groove 511c through the flow path between the second cup 50b and the third cup 50c. Then, the processing liquid is discharged from the third drain pipe 512c to the drain port 51. The processing liquid discharged from the processing unit 16 is recovered by a recovery tank (not illustrated).

On the top surface of the wafer W to which the processing liquid is supplied, the gas supplied from the FFU 21 flows from the central side towards the peripheral edge side, and the gas is also discharged outwardly from the gap between the guide 312 and the rotary cup 313. In the processing unit 16 of the present example, the exhaust is not performed on the flow path between the second cup 50b and the third cup 50c, whereas the atmosphere in the cylindrical flow path 521 is exhausted through the exhaust port 52. As a result, the pressure in the flow path between the second cup 50b and the third cup 50c becomes high, for example, to the extent of several Pa, as compared with that in the cylindrical flow path 521.

Hence, the gas flows in the flow path between the rotary cup 313 and the inclined portion 501c of the third cup 50c, and then, flows into the cylindrical flow path 521 having a low pressure, which is disposed above the drain path (the flow path between the second cup 50b and the third cup 50c). Further, although a gas flowing from the space between the guide 312 and the rotary cup 313 flows into the flow path between the second cup 50b and the third cup 50c by an action of a centrifugal force, the gas flows out towards the cylindrical flow path 521 having a low pressure.

Then, the drain path and the cylindrical flow path 521, which is an exhaust path, are separated from each other through the inclined portion 501c of the third cup 50c. Since the drain path is not in communication with the exhaust port 52 of the exhaust path, the processing liquid and the gas may be separately discharged.

At this time, as described above, the first cup 50a and the second cup 50b are moved to the retreat position where the processing liquid scattered from the wafer W does not reach, and the inclined portions 501a, 501b are overlapped, so that the inlet of the flow path between the first cup 50a and the second cup 50b is closed. In addition, since the exhaust is not performed in the space in the first cup 50a and the flow path between the first cup 50a and the second cup 50b, these spaces are also at a high pressure, as compared with the cylindrical flow path 521. As a result, the gas including the processing liquid or mists of the processing liquid is suppressed from flowing into the spaces. Therefore, the loss of the processing liquid or the generation of contamination may be suppressed by recovering the processing liquid in use to a correct recovery site.

The gas flowing into the cylindrical flow path 521 flows downwardly in the cylindrical flow path 521, and flows into the collecting exhaust unit 522 through the slits 551 of the baffle ring 55 as illustrated in FIGS. 3 and 4. The gas that flows into the collecting exhaust unit 522 to interflow is discharged to the outside through the exhaust port 52.

When the liquid processing is performed with the first processing liquid for a preset period of time in this manner, the liquid processing of the wafer W is performed while switching the kinds of processing liquids, for example to a second kind of processing liquid or a third kind of processing liquid (e.g., a rinse liquid or an acidic chemical liquid) in a preset order. At this time, the discharge site of the processing liquid scattered from the wafer W is changed when the first cup 50a and the second cup 50b are moved up and down between the processing position and the retreat position in accordance with the switching timing of the kinds of processing liquids (FIGS. 6 and 7).

Also in these cases, since the exhaust is not performed in the flow path in which the processing liquid is being discharged (e.g., the flow path between the first cup 50a and the second cup 50b in FIG. 6, and the space in the first cup 50a in FIG. 7), the pressures in the flow paths are set to be higher than the pressure in the cylindrical flow path 521. Accordingly, even in a case where the processing liquid discharging flow path is changed, the gas flowing out from the wafer W side is discharged towards the cylindrical flow path 521.

Further, since the exhaust is not performed in the flow path in which the recovery of the processing liquid is not performed (e.g., the flow path between the second cup 50b and the third cup 50c in FIG. 6, and the flow path between the first cup 50a and the second cup 50b and the flow path between the second cup 50b and the third cup 50c in FIG. 7), the gas including the processing liquid or mists of the processing liquid is suppressed from flowing into the flow paths. As a result, in the examples of FIGS. 6 and 7, the loss of the processing liquid or the generation of contamination may also be suppressed by recovering the processing liquid in use to a correct recovery site.

When the liquid processing with various processing liquids is completed in this manner, the supply of the processing liquids is stopped, and, after the processing liquid remaining on the surface of the wafer W is scattered, the rotation of the wafer W is stopped. Then, the wafer W is delivered to the substrate conveyance device 17, which has entered into the chamber 20, in an order opposite to that performed when carrying into the chamber 20, so that the wafer W is carried out from the processing unit 16.

Here, the cleaning mechanisms 41, 42 perform a cleaning on the cylindrical flow path 521 or the collecting exhaust unit 522 during a delivery period in which the next wafer W is carried into the processing unit 16, at a the time of switching lots of the wafers W, or when a preset time has elapsed.

The processing unit 16 according to the present exemplary embodiment provides the following effects. Since exhaust paths (the cylindrical flow path 521 and the collecting exhaust unit 522) are formed to perform an exhaust of a gas, independently from the first cup 50a and the second cup 50b (the inner cups), and the third cup 50c (the outer cup), which form drain paths to receive processing liquids scattered from the rotating wafer W, and discharge the processing liquids to the drain port 501, a plurality of processing liquids may be precisely sorted and discharged.

Next, variations of the exemplary embodiments of the present disclosure will be described with reference to FIGS. 8 to 10 and 11A and 11B. In FIGS. 8 to 10 and 11A and 11B, the same reference numerals are given to the same parts as those illustrated in FIGS. 3 to 7.

Figure 8:
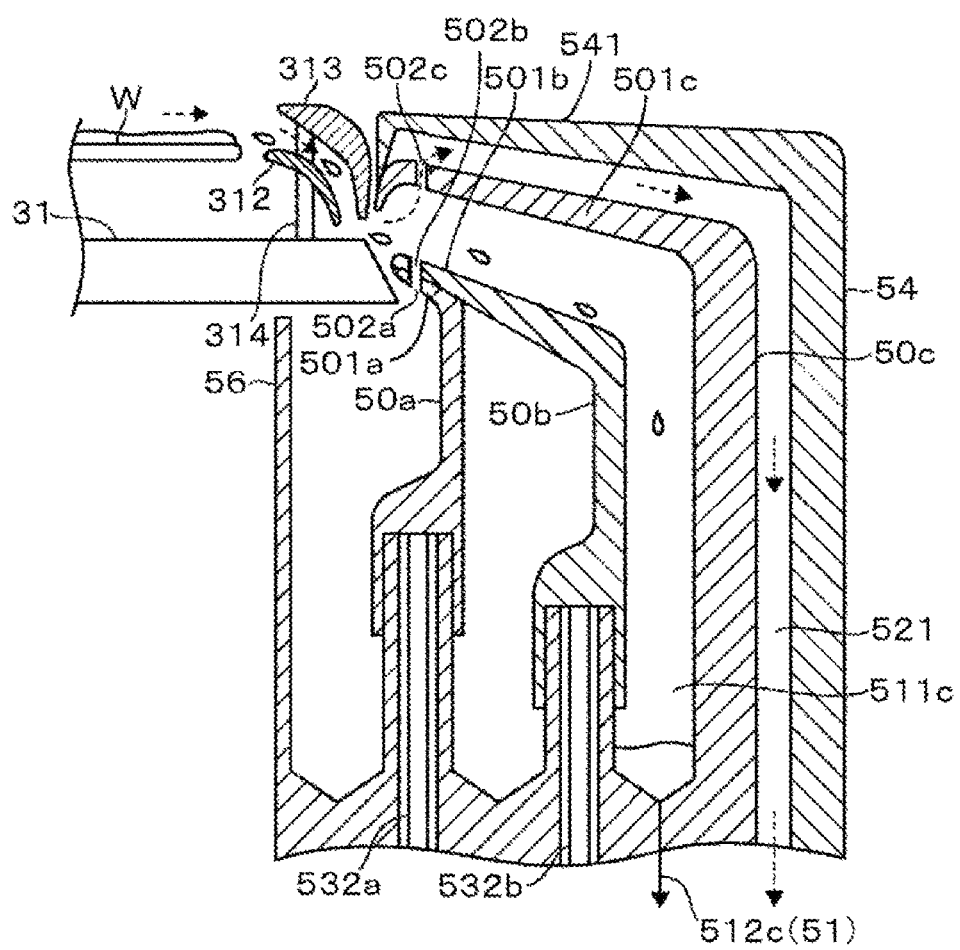
FIG. 8 is a first explanatory view illustrating an action of a processing unit according to another exemplary embodiment.
Figure 9:
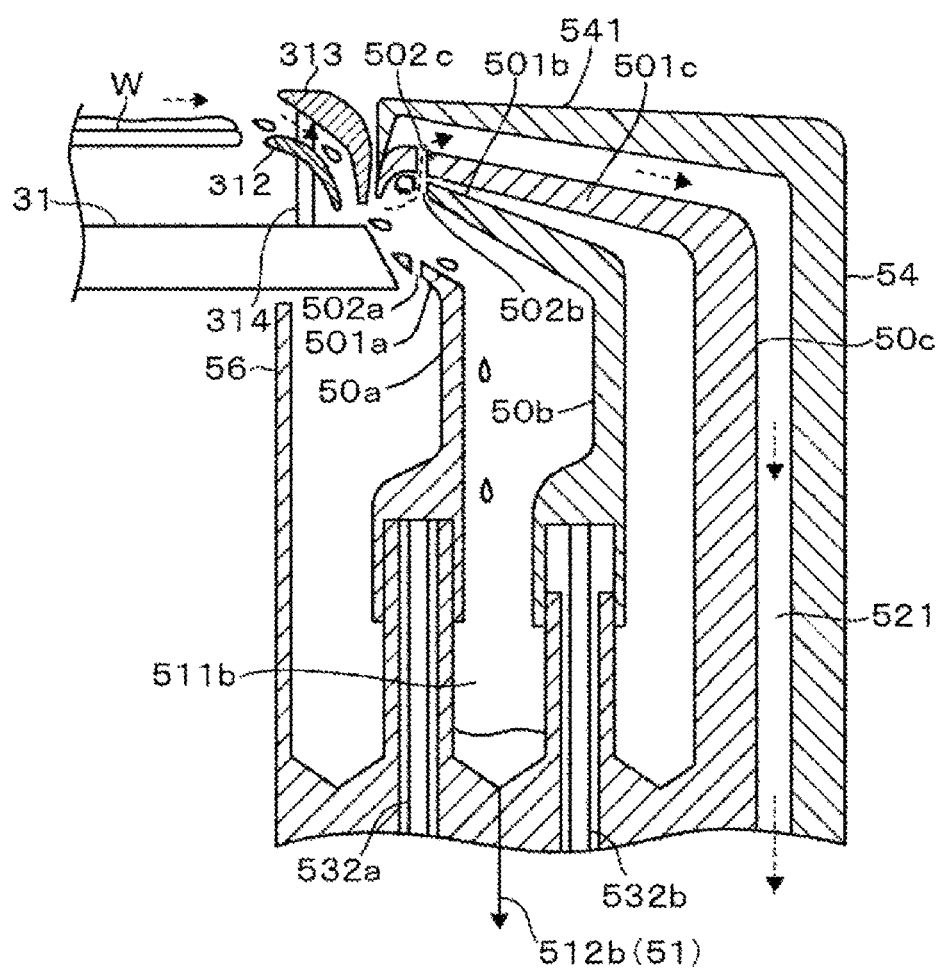
FIG. 9 is a second explanatory view illustrating an action of the processing unit according to another exemplary embodiment.

The opening that takes a gas into the cylindrical flow path 521 constituting the exhaust path is not limited to a case where the opening is formed along the mouth of the third cup (the outer cup) 50c (see, e.g., FIG. 5). For example, as illustrated in FIGS. 8 and 9, the slits 502a to 502c in communication with each other may be formed in the inclined portions 501a to 501c of the first cup 50a, the second cup 50b, and the third cup 50c when the inclined portions 501a to 501c are overlapped vertically. Thus, the slits 502a to 502c may serve as openings so as to allow a gas to flow into the cylindrical flow path 501. In this example, the gap between the inclined portion 541 of the cover 54 and the inclined portion 501c of the third cup 50c is closed.

Also, in the present example, the cylindrical flow path 521 is configured to be opened above the inlet of the drain path (the flow path between the second cup 50b and the third cup 50c in the example of FIG. 8, or the flow path between the first cup 50a and the second cup 50b in the example of FIG. 9).

Meanwhile, in the case of the present example, when the first cup 50a or the second cup 50b is moved to the retreat position, the slits 502a, 502b are disposed below a position where the processing liquid guided by the guide 312 and the rotary cup 313 flows out. However, since the processing liquid is scattered strongly towards the inner wall surface of the third cup 50c or the second cup 50b by an action of a centrifugal force, the processing liquid hardly flows into the slits 502a, 502b.

Figure 10:
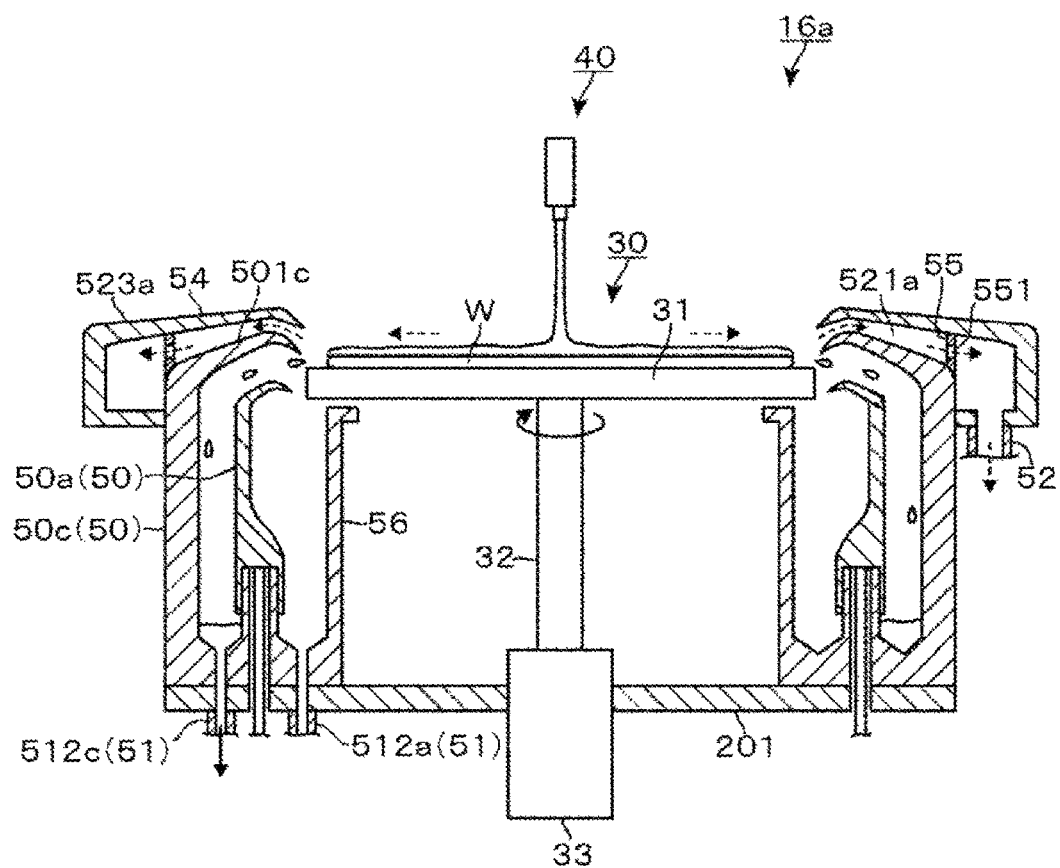
FIG. 10 is a vertical cross-sectional view illustrating a processing unit according to still another exemplary embodiment.

Subsequently, the processing unit 16a illustrated in FIG. 10 is different from the processing unit 16 according to the first exemplary embodiment illustrated in FIGS. 3 to 7 in that the wafer W is placed directly on the holding unit 31 instead of the support pins 311, and the guide 312 and the rotary cup 313 are not provided, and the collecting exhaust unit 522 is not formed below the first cup 50a and the third cup 50c.

A method of fixing the wafer W to the holding unit 31 may employ an electrostatic chuck, and the holding unit 31 may be provided with the rotary cup 313 only. Further, the number of the first cups 50a disposed in the inner side of the third cup 50c may be at least one, or may increase properly depending on the number of the kinds of the processing liquids. Meanwhile, the total number of the first cup 50a, the second cup 50b, and the third cup 50c does not need to accord with the number of the kinds of the processing liquids used for the liquid processing, and a plurality of processing liquids may be collected and received in one of the cups 50a to 50c.

Further, the cover 54 illustrated in FIG. 10 includes a flat annular flow path 521a formed between the cover 54 and the inclined portion 501c formed in the upper end of the third cup 50c. The annular flow path 521a is connected to an annular exhaust pipe 523a that surrounds the side wall surface of the upper portion of the third cup 50c circumferentially. The exhaust pipe 523a is formed with an exhaust port 52, in which an exhaust of a gas is performed. In this case, the annular flow path 521a and the exhaust pipe 523a, which are in communication with the exhaust port 52, constitute the exhaust path. In a case where the collecting exhaust unit 522 is not formed as in the above-mentioned example, the gas may be exhausted uniformly along the circumferential direction of the third cup 50c by changing the opening area of the slits 551 formed in the baffle ring 55 in accordance with a distance from the exhaust port 52 or forming a plurality of exhaust ports 52 along the circumferential direction of the exhaust pipe 523a.

Figure 11A:
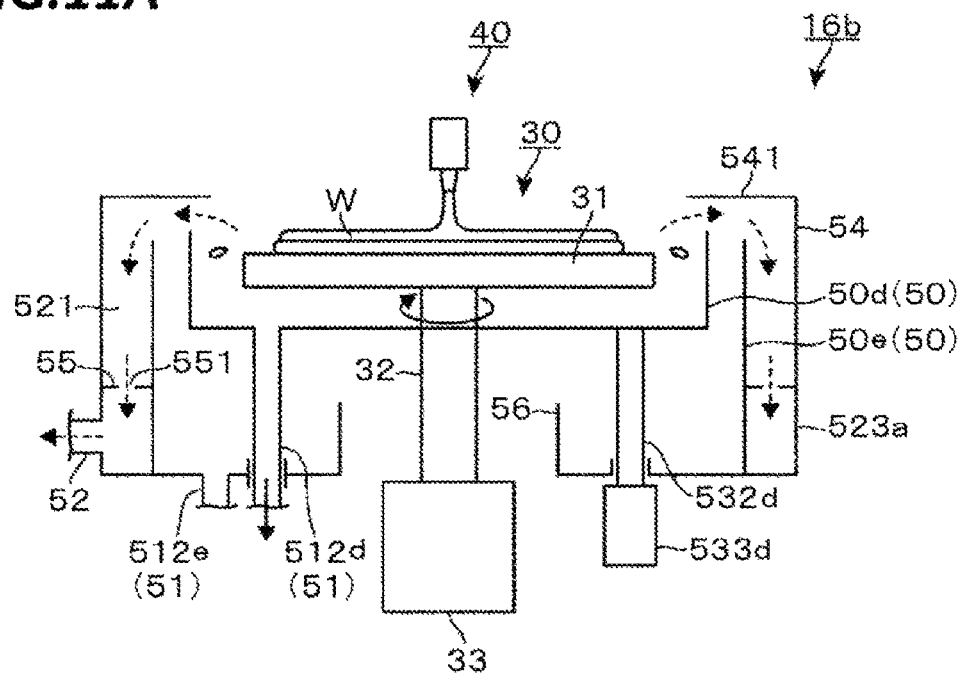
FIGS. 11A and 11B are explanatory views illustrating an action of a processing unit according to yet another exemplary embodiment.
Figure 11B:
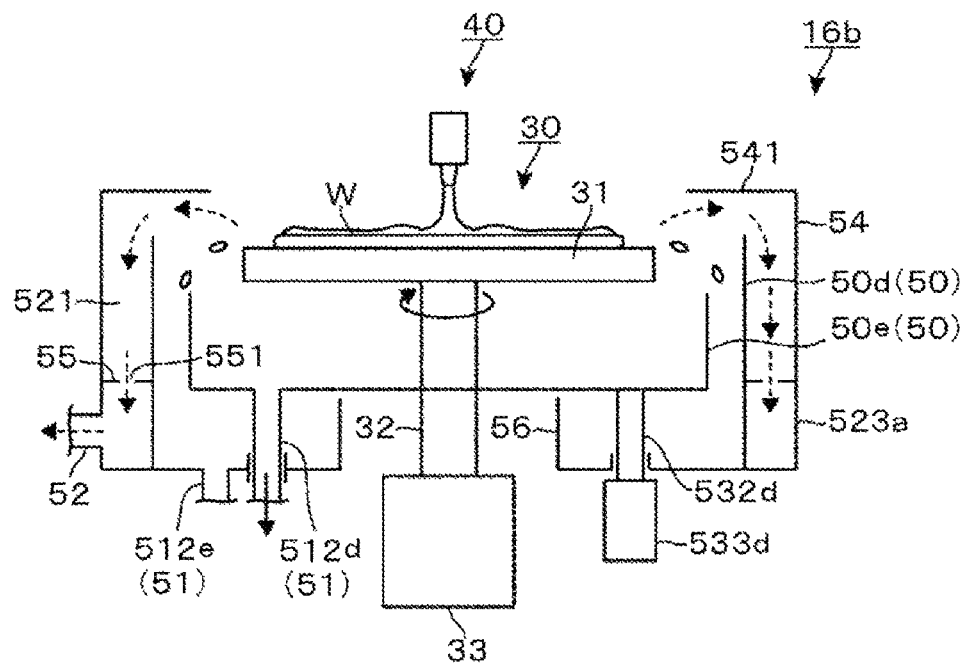

FIGS. 11A and 11B illustrate an example of a processing unit 16 in which no inclined portion is formed in an upper end of an outer cup 50d or an inner cup 50e. In this case, the cups 50e, 50d that receive the processing liquid may be switched by raising or lowering the height position of the upper end of the side wall of the inner cup 50e with respect to the position where the processing liquid is scattered from the wafer W.

Subsequently, descriptions will be made on an exemplary embodiment in which a mechanism for collecting mists included in the exhausted gas is provided in the third cup 50c, with reference to FIGS. 12 to 14.

Figure 12:
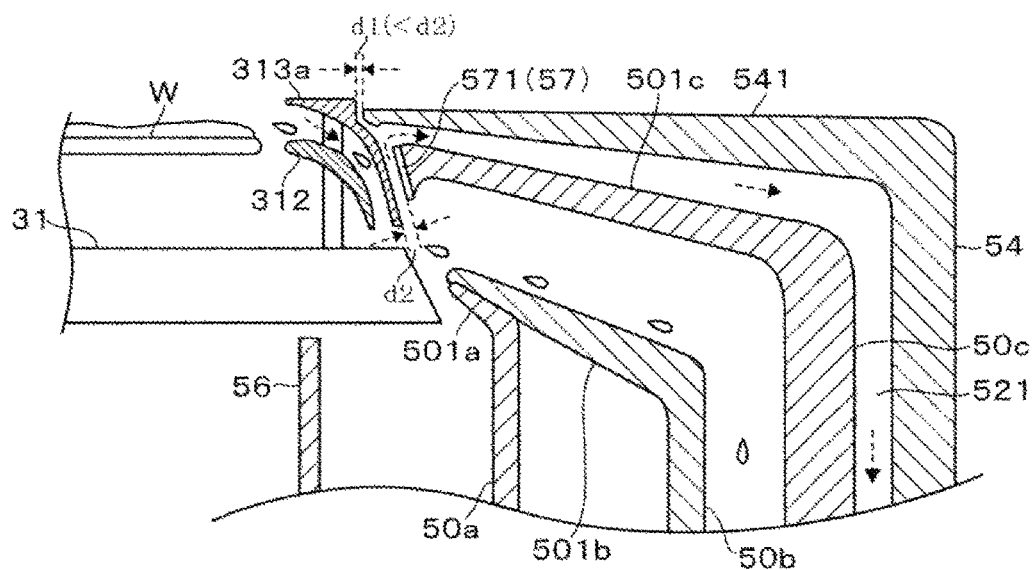
FIG. 12 is a vertical cross-sectional view illustrating a processing unit in which protrusions for liquid collection are formed in a third cup.

As illustrated in the enlarged vertical cross-sectional view of FIG. 12, a rotary cup 313a of the present example is formed to be widened from the central side to the peripheral edge side of the holding unit 31 obliquely downwardly in a fan shape. Further, a tip end portion 57 extending downwardly is formed at a tip end of the inclined portion 501c that is formed in the upper portion of the third cup 50c and extends towards the outer peripheral surface of the rotary cup 313a. The tip end portion 57 is disposed to face and surround the rotary cup 313a from the upward side along the outer peripheral surface of the rotary cup 313a. The configuration in which a predetermined gap is formed between the rotary cup 313a and the tip end portion 57 and the gap defines an exhaust path of a gas, is the same as that of the processing unit 16 according to the first exemplary embodiment illustrated in FIG. 5. Further, the inclined portion 501c corresponds to the top surface of the third cup 50c which is the outer cup.

Figure 13:
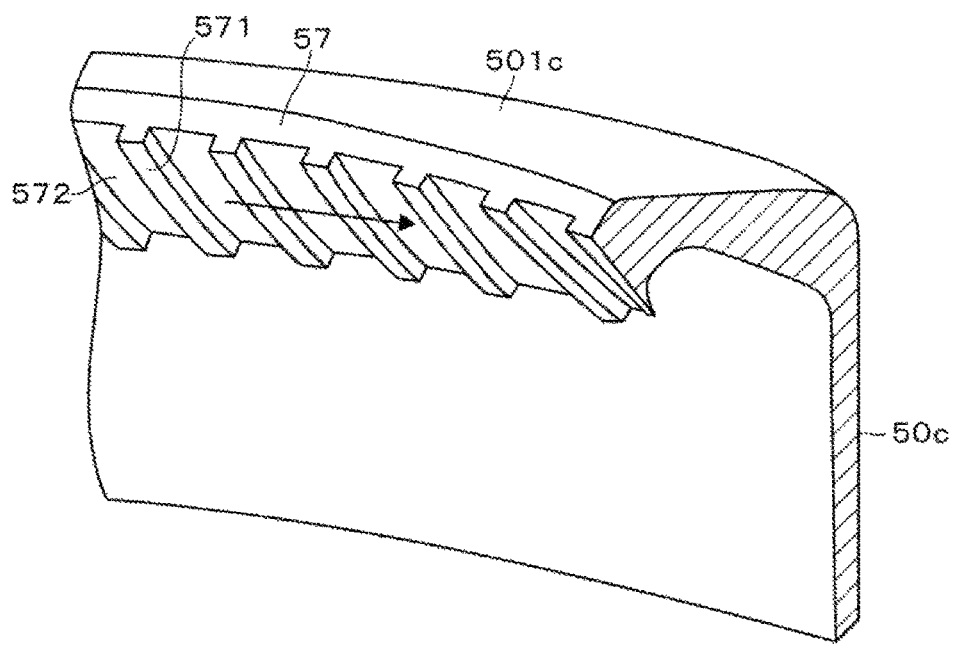
FIG. 13 is a partially cutaway perspective view illustrating the third cup provided with the protrusions.

As illustrated in FIG. 13, a plurality of protrusions 571 is formed on the inner peripheral surface of the tip end portion 57 facing the outer peripheral surface of the rotary cup 313a (that is, a region facing the rotary cup 313a) to collect mists of the processing liquid in the gas flowing from the first to third cups 50a to 50c towards the cylindrical flow path 521 through the gap. As illustrated in the partially cutaway perspective view of FIG. 13 and the schematic view of FIG. 14, the protrusions 571 are arranged along the circumferential direction of the rotary cup 313a to be spaced apart from each other. Hereinafter, recesses between the adjacent protrusions 571 are referred to as "grooves 572". Further, the solid line arrows as illustrated in FIGS. 13 and 14 represents a rotational direction of the rotary cup 313a that rotates at the inward side of the tip end portion 57.

Each protrusion 571 has a width of, for example, about 1 mm to several cm, and is formed to extend in the vertical direction intersecting the rotational direction of the rotary cup 313a. Further, as illustrated in FIG. 14, each protrusion 571 may be formed obliquely with respect to a direction intersecting the rotational direction of the rotary cup 313a (as indicated by a dotted line in FIG. 14) such that its upper end portion is positioned closer to an upstream side of the rotational direction of the rotary cup than its lower end portion.

Subsequently, an action of the protrusions 571 formed in the tip end portion 57 will be described. As illustrated in FIG. 12, the gas flowing into the first cup 50a to the third cup 50c (the space between the second cup 50b and the third cup 50c in the example of FIG. 12) is exhausted towards the cylindrical flow path 521 having a low pressure through the gap between the rotary cup 313a and the tip end portion 57, and the space between the inclined portions 501c, 541 of the third cup 50c and the cover 54. As a result, the gas passes though the gap between the rotary cup 313a and the tip end portion 57 from the lower side to the upper side. Further, a force flowing laterally along the rotational direction of the rotary cup 313a is also added to the air current.

Figure 14:
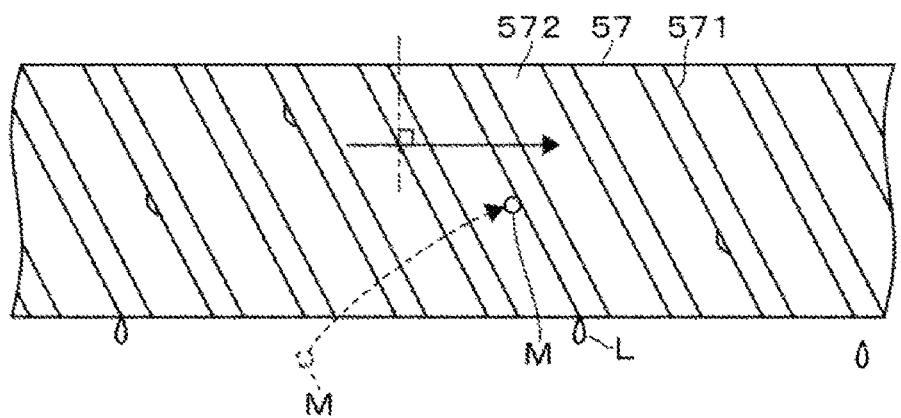
FIG. 14 is a schematic view illustrating an action of collecting liquid with the protrusions.

As a result, as illustrated in FIG. 14, mists M included in the gas is affected by a force that moves obliquely upwardly from the upstream side of the rotational direction of the rotary cup 313a towards the downstream side of the rotational direction along the flow of the gas. Further, since the gas including the mists M is affected by a centrifugal force that pushes the gas from the outer peripheral surface of the rotary cup 313a towards a region where the protrusions 571 are formed, the mists M are entrained in this flow to enter into the grooves 572 between the adjacent protrusions 571.

When the mists M that have entered into the grooves 572 reaches the side wall surfaces of the protrusions 571, the mists M are collected on the side wall surfaces. The collected mists M condense into droplets L on the side wall surfaces, flow down on the side wall surfaces, and then, drop downwardly.

Here, when the upper end portions of the protrusions 571 are positioned closer to the upstream side of the rotational direction of the rotary cup 313a than the lower end portions, the side wall surfaces of the protrusions 571 where the mists M are collected are disposed obliquely downwardly. As a result, the side wall surfaces are disposed to block the flow of the gas rising from the downward side to the upward side. Therefore, the mists M are easily collected. Further, as the side wall surfaces are disposed obliquely downwardly, the collected mists M are easily discharged downwardly.

Meanwhile, the protrusions 571 are not limited to a case where the side wall surfaces of the protrusions 571 performing the collection of the mists M are formed obliquely to be inclined downwardly. For example, the side wall surfaces may be disposed substantially vertically along a direction orthogonal to the rotational direction of the rotary cup 313a.

Further, as illustrated in FIG. 12, it is not essential that the protrusions 571 are configured such that the inner peripheral surfaces thereof are formed obliquely downwardly. For example, as illustrated in FIG. 5, even in a case where the tip end portion of the inclined portion 501c of the third cup 50c is formed substantially vertically or obliquely upwardly to face the rotary cup 313, the action of collecting the mists M in the gas and discharging the mists M as droplets L downwardly is obtained by forming the protrusions 571.

Further, the shape of the protrusions 571 is not limited to the examples illustrated in FIGS. 13 and 14. FIG. 13 illustrates an example of the protrusions 571 provided with side wall surfaces and protruding surfaces and having a rectangular vertical cross-section, but the vertical cross-section of the protrusions 571 may be in a shape having a curved surface such as a semicircular shape. Further, the planar shape of each of the protrusions 571 may be bent to form a curve, for example, in addition to being formed in a linear shape as illustrated in FIG. 14.

FIG. 12 illustrates a distance d1 of the gap between the inclined portion 541 formed in the upper portion of the cover 54 and the rotary cup 313a, and a distance d2 between the rotary cup 313a and the tip end portion 57 of the third cup 50c (the protruding surface of the protrusion 571 in the present example in which the protrusion 571 is formed) constituting the exhaust path of the gas. Comparing these distances, the distance d1 between the inclined portion 541 and the rotary cup 313a is narrower than the distance d2 between the rotary cup 313a and the tip end portion 57 of the third cup 50c (d1<d2).

When the rotary cup 313a rotates in the inside of the cover 54, a pressure in the space between the cover 54 and the rotary cup 313a rises due to the influence of the centrifugal force acting from the rotary cup 313a on the gas. At this time, when the rotary cup 313a, the cover 54, and the tip end portion 57 are disposed to satisfy the relationship of "d1<d2", the gas may be suppressed from leaking upwardly through the gap between the cover 54 and the rotary cup 313a, and a state where the gas is easily discharged towards the cylindrical flow path 521 may be established.

Here, the above-mentioned relationship between the distances of the gaps is not limited to the example of the processing unit 16 illustrated in FIG. 12. Also, for example, in the processing unit 16 provided with the rotary cup 313 as described with reference to FIGS. 3 to 7, the relationship between the distance d1 of the gap between the inclined portion 541 formed in the upper portion of the cover 54 and the rotary cup 313, and the distance d2 between the rotary cup 313 and the tip end portion (no protrusion 571 formed) may satisfy "d1<d2".

Further, the kind of the liquid processing that can apply the processing units 16, 16a, 16b of the present exemplary embodiments is not limited to the cleaning processing unit of the wafer W using an alkaline or acidic chemical liquid. For example, the processing units 16, 16a, 16b are applicable to a coating unit configured to be capable of switching the kinds of resist liquids or plating liquids to be coated on a wafer W, or a developing unit configured to supply a dissolver for dissolving a water-repellant protective film formed on a top surface of a resist film and a developer for developing the resist film, in a switching manner.

And, the kind of substrates to be processed using the processing units 16, 16a, 16b of the present exemplary embodiments is not limited to the semiconductor wafer. For example, the present exemplary embodiments may also be applied to a liquid processing unit which performs a liquid processing of a glass substrate for a flat panel display.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a substrate holding unit configured to hold a substrate;
a processing liquid supplying unit configured to supply a plurality of processing liquids in a switching manner to the substrate held on the substrate holding unit;
an inner cup provided to surround the substrate holding unit laterally to form a first drain path that guides a first processing liquid supplied to the substrate downwardly of the substrate holding unit and drains the first processing liquid;
an outer cup provided to surround the inner cup to form a second drain path that guides a second processing liquid supplied to the substrate downwardly of the substrate holding unit and drains the second processing liquid;
an elevating mechanism configured to move up and down the inner cup between a processing position where the inner cup receives the first processing liquid and a retreat position where the inner cup retreats downwardly from the processing position;
a cover disposed to cover the outside of the outer cup; and
a rotary cup configured to rotate integrally with the substrate holding unit,
wherein the cover includes a cylindrical portion formed in a cylindrical shape and an eaves portion provided in an upper portion of the cylindrical portion and extends inwardly, and forms an exhaust path between the cover and the outer cup,
the exhaust path is commonly connected to the first drain path and the second drain path through a gap formed between the rotary cup and the outer cup at an upper side of inlets of the first drain path and the second drain path,
there is no exhaust path between the inner cup and the outer cup, and
a tip end portion of the outer cup includes a bent portion bent inwardly and downwardly and disposed to be spaced apart from the rotary cup with the gap therebetween, and the gap between the bent portion and the rotary cup forms a flow path to guide a gas flowing out from the substrate holding unit upwardly toward the exhaust path.

2. The substrate liquid processing apparatus of claim 1, wherein besides the exhaust path, only drain pipes, each of which discharges a processing liquid, is connected to the first drain path and the second drain path.

3. The substrate liquid processing apparatus of claim 1, wherein
the rotary cup is configured to guide the processing liquids towards a disposition direction of the inner cup or the outer cup that receives the processing liquids,
wherein a part of the exhaust path is formed between the cover and the rotary cup.

4. The substrate liquid processing apparatus of claim 3, wherein a top surface portion is formed in an upper portion of the outer cup, the top surface portion including a tip end portion that extends inwardly towards an outer peripheral surface of the rotary cup and faces the outer peripheral surface of the rotary cup to form a part of the exhaust path,
a plurality of protrusions is formed in a region of the tip end portion that faces the rotary cup, the plurality of protrusion being arranged along a circumferential direction of the rotary cup to be spaced apart from each other and extending vertically.

5. The substrate liquid processing apparatus of claim 4, wherein each of the protrusions is formed obliquely such that its upper end portion is positioned closer to an upstream side in a rotational direction of the rotary cup than its lower end portion.

6. The substrate liquid processing apparatus of claim 3, wherein a top surface portion is formed in an upper portion of the outer cup, the top surface portion including a tip end portion that extends inwardly towards an outer peripheral surface of the rotary cup,
a tip end of the eaves portion constituting the cover faces the outer peripheral surface of the rotary cup, and
a distance between the eaves portion and the rotary cup is narrower than a distance between the rotary cup and the tip end portion.

7. The substrate liquid processing apparatus of claim 1, wherein the exhaust path includes a collecting exhaust unit formed therein and configured to cause a gas exhausted along the circumferential direction of the outer cup to interflow and then discharge the gas to the outside.

8. The substrate liquid processing apparatus of claim 7, further comprising:
an inlet configured to allow the gas to flow into the collecting exhaust unit,
wherein the inlet is a slit.

9. The substrate liquid processing apparatus of claim 7, further comprising:
an inlet configured to allow the gas to flow into the collecting exhaust unit,
wherein an opening area of the inlet is smaller than an opening area of an exhaust port for discharging the gas from the collecting exhaust unit to the outside.

10. The substrate liquid processing apparatus of claim 7, wherein the collecting exhaust unit is formed at a lower side of the inner cup and the outer cup.

11. The substrate liquid processing apparatus of claim 7, wherein the inner cup and the outer cup are provided with drain pipes each communicating with a drain port configured to drain the first processing liquid or the second processing liquid, and the drain pipes penetrates through the collecting exhaust unit.

12. The substrate liquid processing apparatus of claim 7, wherein the elevating mechanism moves up and down the inner cup through a support member configured to support the inner cup, the elevating mechanism is disposed below the collecting exhaust unit, and the support member penetrates through the collecting exhaust unit.

13. The substrate liquid processing apparatus of claim 7, further comprising:
   a cleaning mechanism configured to clean the inside of the collecting exhaust unit.

14. The substrate liquid processing apparatus of claim 1, further comprising:
   a cleaning mechanism configured to clean the inside of the exhaust path.

15. The substrate liquid processing apparatus of claim 1, wherein a pressure in a flow path between the inner cup and the outer cup is higher than a pressure in the exhaust path.

* * * * *